United States Patent
Ikuko et al.

(10) Patent No.: US 6,255,775 B1
(45) Date of Patent: Jul. 3, 2001

(54) SHADOW MASK, A METHOD OF MANUFACTURING A COLOR THIN FILM ELECTROLUMINESCENT DISPLAY APPARATUS USING THE SHADOW MASK, AND A COLOR THIN FILM ELECTROLUMINESCENT DISPLAY APPARATUS

(75) Inventors: Ishii Ikuko; Ootsuki Shigeyoshi, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/078,573

(22) Filed: May 14, 1998

(30) Foreign Application Priority Data

May 15, 1997 (JP) .................................................. 9-125188

(51) Int. Cl.⁷ ................................ H01J 1/62; H01J 29/80

(52) U.S. Cl. ........................... 313/506; 313/504; 313/402

(58) Field of Search ..................................... 313/402, 403, 313/407, 506, 504, 509; 427/252, 66, 265, 282, 250; 204/192.1, 298, 192 R, 192.12

(56) References Cited

U.S. PATENT DOCUMENTS

| | | | | |
|---|---|---|---|---|
| 3,574,013 | * | 4/1971 | Frantzen | 313/402 |
| 5,294,869 | * | 3/1994 | Tang et al. | 313/504 |
| 5,703,436 | * | 12/1997 | Forrest et al. | 313/506 |

* cited by examiner

*Primary Examiner*—Ashok Patel
*Assistant Examiner*—Joseph Williams
(74) *Attorney, Agent, or Firm*—McGuireWoods LLP

(57) ABSTRACT

A method of manufacturing a color thin film electroluminescent display apparatus includes steps of: forming anodes consisting of an ITO on a transparent support substrate; forming a hole transporting layer thereon; carrying the substrate on a substrate holder within a vacuum evaporation device; placing a shadow mask, in which a side surface of opening sections has a taper, between the substrate and first, second and third resistance heat boats; evaporating a green electroluminescent material by means of the first heat boat and forming a green luminous layer on the substrate; evaporating a blue electroluminescent material by means of the second heat boat and forming a blue luminous layer on the substrate; successively, evaporating a red electroluminescent material by means of the third heat boat and forming a red luminous layer on the substrate; and thereafter, forming cathodes on the luminous layers.

16 Claims, 5 Drawing Sheets

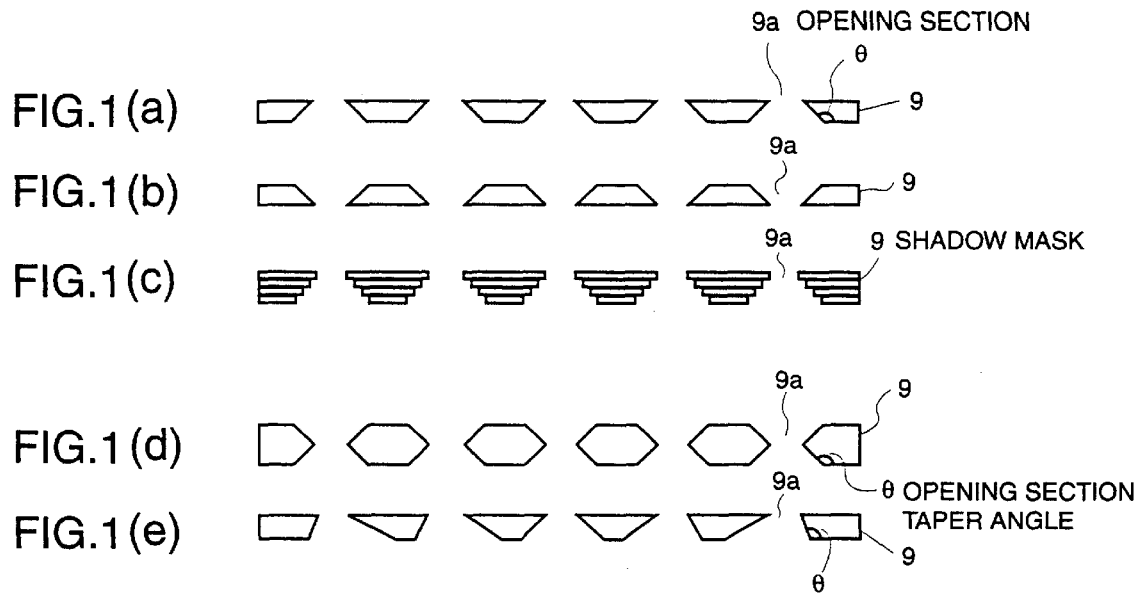
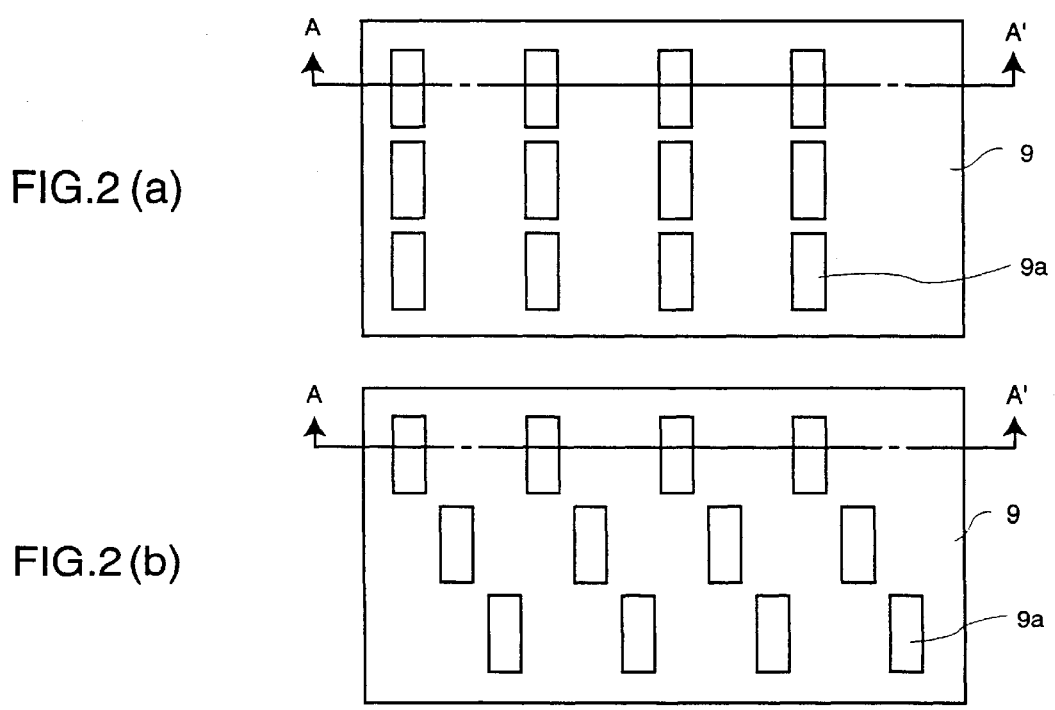

1 PICTURE ELEMENT

SHADOW MASK, A METHOD OF MANUFACTURING A COLOR THIN FILM ELECTROLUMINESCENT DISPLAY APPARATUS USING THE SHADOW MASK, AND A COLOR THIN FILM ELECTROLUMINESCENT DISPLAY APPARATUS

BACKGROUND OF THE INVENTION

The present invention relates to a shadow mask for forming a thin film electroluminescent pattern by means of a vapor growth method, a method of manufacturing a thin film electroluminescent display apparatus using the shadow mask and a thin film electroluminescent display apparatus, and more particularly to a shadow mask used for forming a thin film luminescent pattern having different luminous colors for fine pitches, a method of manufacturing a color thin film electroluminescent display apparatus using the shadow mask and a color thin film electroluminescent display apparatus.

As one structure of color thin film electroluminescent display apparatuses, as shown in FIG. 7, a pixel having different luminous colors (for example, a green luminous layer 5, a blue luminous layer 6 and a red luminous layer 7) is placed on a transparent support substrate 1 in a two dimensional matrix, and one of them, there is an apparatus for realizing a color display, in which different organic luminous materials are used for each color pixel and each color is independently emitted without using a color filter and so forth. In order to form an organic electroluminescent layer in an organic electroluminescent display apparatus having such a structure, it is necessary to form respective different organic electroluminescent films for different regions corresponding to luminous colors. For this, usually, shadow masks for luminous colors (for example, green, blue and red) are prepared, and to form electroluminescent films of each color is conducted while exchanging the shadow masks. However, in this method, it is necessary to prepare three shadow masks, and in addition, it is also necessary to conduct exchange work as many as times of the number of the masks. In order to avoid this complexity, as disclosed in JP-A-227276-1996, there is a method of forming a film in which the number of a mask to be used is one, and shadow masks are successively moved in each step of forming a luminous layer. In this method, using a shadow mask 9 as shown in FIG. 8, in which opening sections 9a are arranged in an oblique direction, a red luminous layer, a green luminous layer and a blue luminous layer are individually evaporated by successively moving this shadow mask on a substrate 1 along an arrow shown in the figure.

FIGS. 9(a)–(d) are cross sectional views showing steps, in order, of manufacturing an organic electroluminescent display panel in accordance with this method. At first, after anodes 2 are formed on a transparent support substrate 1, a hole transporting layer 4 is formed on an entire surface of a pixel formation area. And, after opening sections 9a of a shadow mask 9 are positioned to the anodes 2, a method such as evaporation is applied to a first organic electroluminescent medium such as a green luminous layer 5 to form a film with a thickness of about 10–100 nm (FIG. 9(a)). A section of the opening sections 9a of the shadow mask 9 is at a right angle to a main surface of the shadow mask 9, and each opening section 9a thereof has size corresponding to one of each luminous color element as shown in FIG. 9.

Next, as shown in FIG. 9(b), after the shadow mask 9 is shifted from a position shown in FIG. 9(a) on the left side for a distance of one luminous element, a film with a predetermined film thickness is formed of a second organic electroluminescent medium such as a blue luminous layer 6. Next, as shown in FIG. 9(c), the opening sections 9a of the shadow mask 9 are positioned to a remaining part of the luminous element, and a film with a predetermined film thickness is formed of a third organic electroluminescent medium such as a red luminous layer 7.

After three colors of organic electroluminescent luminous layers are formed, cathodes 8 are formed thereon as shown in FIG. 9(d).

In a color organic thin film electroluminescent display apparatus manufactured in such a manner, a voltage 5–20 V is usually applied between the anodes and the cathodes which constitute a desired pixel to flow a current through the organic electroluminescent layers, and an arbitrary pattern is radiated to conduct a display.

In the above-mentioned conventional method of forming the color thin film electroluminescent display apparatus, since the shadow masks for a kind of the luminous colors are prepared and exchange of the masks is conducted every time when the luminous layer of each color is formed, there was a problem that a process was complicated. Also, in the method wherein the shadow masks are moved every time when the luminous layer is evaporated, since it is necessary to provide a mechanism for moving the masks in an evaporation device, the apparatus is complicated. Moreover, since positioning has to be conducted every time when the shadow masks are exchanged or moved, it is difficult to maintain positioning accuracy between luminous layers of each color and between wafers, whereby there was a problem that it became to be difficult to manufacture the apparatus with good accuracy and high repeatability.

Furthermore, in the conventional method of forming the electroluminescent display apparatus, during the exchange or movement of the shadow masks, there is a possibility that the shadow masks come into contact with the organic electroluminescent thin film that has been formed previously, and an alien substance occurs and damage of the organic electroluminescent thin film occurs, whereby a problem occurs which introduces a lowering of display quality of the electroluminescent display apparatus due to the damage of the electroluminescent thin film and attachment of the alien substance to the organic electroluminescent panel.

Also, in the conventional shadow masks, a pattern of the opening sections has been fined in order to obtain a fine pattern. In this case, however, if a plate thickness of the shadow masks is thick, the thickness makes a shade and a fine pattern of thin film cannot be obtained. Accordingly, the thickness of the shadow masks has to be thin. However, if the thickness is made to be thin, the strength of the shadow masks is lowered and handling thereof becomes to be difficult, whereby there is a problem that the shadow masks break when they are actually used.

SUMMARY OF THE INVENTION

Therefore, the objective of the present invention is first to solve a task that a color thin film electroluminescent display apparatus having a fine pitch can be manufactured by means of a simple process and with good accuracy without exchanging or moving shadow masks for forming a thin film, and the objective of the present invention is secondly to solve a task that to fine an electroluminescent pattern can be realized without making the shadow masks to be a thin film.

The objective of the present invention is achieved by a shadow mask in which a plurality of opening sections are formed at a constant spacing and which is characterized in that the above-described opening sections have a cross sectional shape that is not perpendicular to a main surface so that evaporated substances from different evaporation sources are preferentially guided to different positions on a substrate.

The objective of the present invention is also achieved by a method of manufacturing a color thin film electroluminescent display apparatus, which is characterized in that a shadow mask, in which a cross sectional shape of opening sections is formed obliquely from perpendicularity to a main surface, is placed between a plurality of evaporation sources and a substrate while maintaining a constant spacing from the substrate, and an electroluminescent thin film is selectively formed on the substrate by means of a vapor growth method.

Moreover, the objective of the present invention is achieved by a color thin film electroluminescent display apparatus which includes a substrate, anodes formed on the substrate, and an electroluminescent layer. The an electroluminescent layer has a hole transporting layer formed on the substrate and the anodes, and luminous layers formed on the hole transporting layer. The display apparatus further includes cathodes formed on the hole transporting layer and the luminous layers. The luminous layers are formed through a shadow mask in which a plurality of opening sections are formed at a constant spacing, the opening sections having a cross sectional shape that is not perpendicular to a main surface in accordance with a direction along which evaporated substances from evaporation sources come flying.

BRIEF DESCRIPTION OF THE DRAWINGS

This and other objects, features and advantages of the present invention will become more apparent upon a reading of the following detailed description and drawings, in which:

FIGS. 1(a) to (e) are cross sectional views of shadow masks for explaining an implementation form of the present invention;

FIGS. 2(a) and (b) are plan views of shadow masks for explaining an implementation form of the present invention;

DESCRIPTION OF THE EMBODIMENTS

Figure 3:
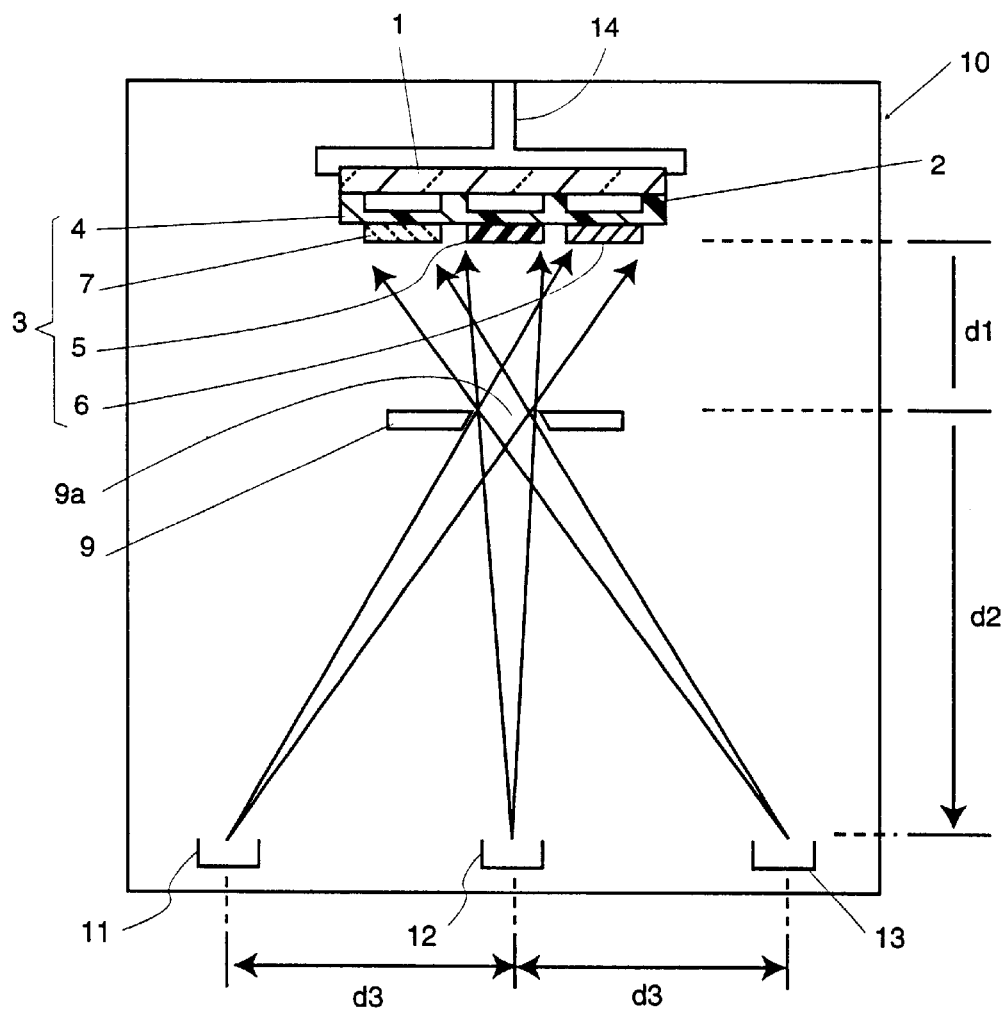
FIG. 3 is a cross sectional view of a vacuum evaporation device for explaining an implementation form of the present invention.

Next, an implementation form of the present invention will be explained by referring to drawings.

FIGS. 1(a) to (e) are cross sectional views of a shadow mask made of metal, which is used in the present invention, FIGS. 2(a) and (b) are plane views thereof, and FIG. 1 shows a section that is taken along a line A–A' of FIG. 2.

A shadow mask 9 used in the present invention is made of metal, as shown in FIG. 1(a), of which opening sections 9a are formed by means of a wet-etching method using a photoresist and have a taper angle $\theta$ to a main surface. The thickness thereof is 0.5 mm, for example. Here, the taper angle $\theta$ is an angle with the main surface of the opening sections on a side of evaporation sources (vaporization sources) of the shadow mask, and therefore, $(\theta-\pi/2)$ is obliqueness from a direction perpendicular to the main surface of the shadow mask. By means of this taper, evaporated substances from the evaporation sources slanting from the direction perpendicular to the main surface of the shadow mask can be efficiently guided to a desired region on a substrate that is placed at a predetermined spacing from and in parallel with the shadow mask, and a thin film of predetermined size can be formed with good accuracy.

A shadow mask shown in FIG. 1(b) has a shape in which the shadow mask shown in FIG. 1(a) is placed upside down, and can be formed in the same manner as the shadow mask in FIG. 1(a) and the same advantage can be expected.

A shadow mask shown in FIG. 1(c) is manufactured by piling up a plurality of thin metal plates of which opening sections have dimensions different from each other step by step and pasting them together, in order to obtain a desired taper angle at the opening sections 9a of the shadow mask 9. In this case, without strictly controlling the taper angle $\theta$ of the opening sections 9a in the wet-etching during manufacture of the shadow mask, the same function as in an example of FIG. 1(a) can be obtained.

An example shown in FIG. 1(d) is manufactured by pasting the shadow mask shown in FIG. 1(a) and the shadow mask shown in FIG. 1(b) together. In this case, since the thickness of the shadow mask 9 can be large, the strength of the shadow mask increases, and since a taper on a side of a transparent support substrate acts as a guide, even if the evaporated substances do not come flying in parallel, positioning accuracy of a region where the thin film is formed can be maintained.

An example shown in FIG. 1(e) is formed so that the taper angle $\theta$ is gradually large as the shadow mask goes away from the evaporation sources. Thereby, even if the evaporated substances from the evaporation sources do not come flying in parallel, positioning accuracy of a region where the thin film is formed can be obtained.

Also in the shadow mask shown in FIG. 1(e), like in that shown in FIG. 1(b), the taper angle at the opening sections may be determined on a surface on a side of the substrate of the shadow mask. Furthermore, in that manner, a thick mask can be formed by pasting the shadow mask shown in FIG. 1(e) and a shadow mask formed symmetrically up and down to the shadow mask shown in FIG. 1(e) together, as shown in FIG. 1(d). Also, the shadow mask shown in FIG. 1(d) or (e) may be manufactured by pasting a plurality of thin metal plates together of which opening sections have dimensions different from each other step by step, as shown in FIG. 1(c).

The opening sections 9a of these shadow masks are arranged so that, as shown in FIG. 2(a), an arrangement along a longitudinal direction and an arrangement along a lateral direction are orthogonal to each other, or so that, as shown in FIG. 2(b), the arrangement along the lateral direction is parallel with a side of the mask, and the arrangement along the longitudinal direction and the side of the mask obliquely cross.

FIG. 3 is a cross sectional view of an evaporation device for explaining an implementation form of the present invention, and in the figure, the relation of positions between the shadow mask 9, pitches of the luminous elements (6, 7 and 8), the transparent support substrate 1, and resistance heat boats 11, 12 and 13 within a vacuum evaporation device 10 is shown. A distance between the transparent support substrate 1 and the shadow mask 9 is d1, a distance from the resistance heat boat 12 located just under the center of the shadow mask 9 to the shadow mask 9 is d2, and a distance between the adjacent resistance heat boats is d3. Also, a pitch of the luminous elements is p. Here, d1, d2, d3. and p are designed so as to satisfy the following equations:

$$d1 = p \times \tan(\pi - \theta) \quad (1)$$

$$d3 = p \times (d2/d1) \quad (2)$$

The shadow mask 9 shown in FIG. 1(*a*) for example is mounted within the vacuum evaporation device 10, and the transparent support substrate 1 is carried on a substrate holder 14. On the transparent support substrate 1, anodes 2 previously consisting of transparent conductive films such as ITO films corresponding to each luminous element, and the hole transporting layer 4 are formed. At first, by means of the resistance heat boat 12, a green organic luminous material is heated and evaporated, and a green luminous layer 5 is formed on the substrate through the shadow mask 9. Successively, by means of the resistance heat boat 11, a blue organic luminous material is heated and evaporated, and a blue luminous layer 6 is formed on the substrate through the shadow mask 9. Next, by means of the resistance heat boat 13, a red organic luminous material is heated and evaporated, and a red luminous layer 7 is formed on the substrate through the shadow mask 9. Thereby, an organic electroluminescent layer 3 consisting of the hole transporting layer 4 and the luminous layers 5, 6 and 7 is formed.

The aforementioned order of the evaporation of the luminous materials can be suitably changed. Also, in the present invention, the luminous material is not limited to the organic material and may be an inorganic material. Furthermore, as means for evaporating the luminous material, other commonly used heat means can be used instead of the resistance heat. Also, the luminous layers may be formed by means of a spattering method instead of the evaporation method.

Next, embodiments of the present invention will be explained in detail by referring to the drawings.

Figure 4:
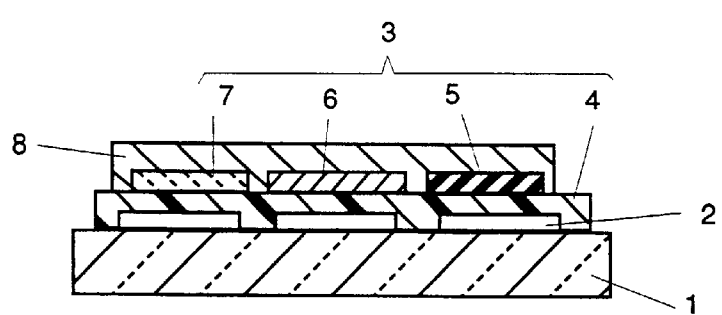
FIG. 4 is a cross sectional view of a color organic thin film electroluminescent display apparatus for explaining first and second embodiments of the present invention.

FIG. 4 is a cross sectional view of a color organic thin film electroluminescent display apparatus manufactured by the present invention (However, for simplicity, the apparatus only for one pixel is shown and the apparatus for other pixels is abbreviated.). As shown in the figure, the anodes 2 are formed on the transparent support substrate 1 consisting of a non-alkaline glass board with a thickness of 1.1 mm by forming an ITO film with a film thickness of 100 nm by means of a sputtering method and forming a pattern of it. The non-alkaline glass board having low adsorption of water is desirable for a substrate material. However, if paying attention to a process by fully drying the substrate for example, a cheap low-alkaline glass board or soda-lime glass board may be used. Since the ITO film acts as the anodes 2 and conducts a display by transmitting a light occurred in the organic electroluminescent layer 3, it is preferable that the ITO film has a low resistance and a high light transmission factor. The pattern of the ITO has a line pitch of 0.2 mm, a line width of 0.16 mm, a length of 27 mm, and the number of 384.

Next, the transparent support substrate 1 is carried on the substrate holder 14 within the vacuum evaporation device 10 shown in FIG. 3 with the anodes 2 facing downward, an N,N'-diphenyl-N,N'-bis(α-naphthyl)-1,1'-biphenyl-4,4'-diamine (referred to as an α-NPD, hereinafter) is put into the resistance heat boats, and an air within the vacuum evaporation device 10 is exhausted below about $1 \times 10^{-4}$ Pa by a vacuum pump. Thereafter, the metal shadow mask is set so as to be fixed to the substrate on a side of the anodes 2 of the transparent support substrate 1, and in the metal shadow mask, a range on which the hole transporting layer 4 is evaporated is bored into a quadrangle, and a current flows through the resistance heat boats within the vacuum evaporation device 10 which are placed under this substrate and the shadow mask 9 and into which the α-NPD is put, and the resistance heat boats are heated. An α-NPD layer is evaporated with a film thickness of about 50 μm to form the hole transporting layer 4.

Next, an organic luminous material is evaporated with the metal shadow mask 9 spaced at a distance of 1.1 mm from and parallel with the transparent support substrate 1, wherein the shadow mask has a opening section taper angle θ is 110 degrees and an opening width of the opening sections 9*a* on a side of the transparent support substrate 1 is 0.2 mm.

In order to obtain accuracy of a position at which the evaporated film is formed, it is important to fix the shadow mask 9 so as not to be loosened, and as a method for this, there is a method of fixing the shadow mask utilizing a tension, such as a silk-screen. At this time, in order not to damage the previously formed hole transporting layer 4 due to contact of the shadow mask 9 with the transparent support substrate 1, and in order to be able to prevent the evaporation material from spreading, a spacer may be placed to maintain a constant distance between the transparent support substrate 1 and the shadow mask 9.

Next, in the vacuum evaporation device 10 shown in FIG. 3, a distyrene derivative or a coumaline derivative is put into the resistance heat boat 11, a tris(8-quinolinolate) aluminum complex (referred to as an Alq3, hereinafter) is put into the resistance heat boat 12, a magnesium phthalocyanine is input into the resistance heat boat 13, and an air within the vacuum evaporation device 10 is exhausted below about $1 \times 10^{-4}$ Pa by a vacuum pump. At this time, in accordance with the equations (1) and (2), the distance d2 between the shadow mask 9 and the resistance heat boat 12 located just under the center of a main surface of the shadow mask 9 is set to be 353 mm, and the distance d3. between the resistance heat boats that are evaporation sources is set to be 62 mm. The resistance heat boats 11 and 13 are set so that lines connecting the resistance heat boats 11 and 13 to the ends of the opening section of the shadow mask 9 correspond to a taper angle θ of the opening section 9*a*.

Figure 5:
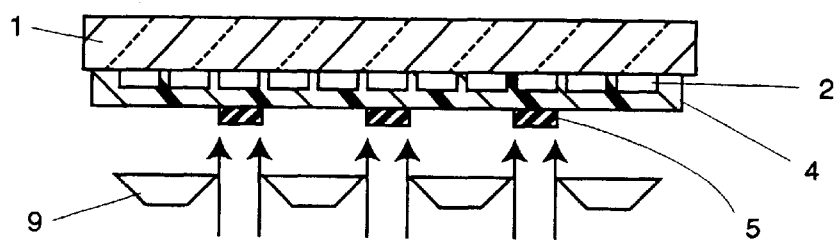
FIGS. 5(a) to (c) are cross sectional views showing evaporation condition for explaining the first embodiment of the present invention.
Figure 5:
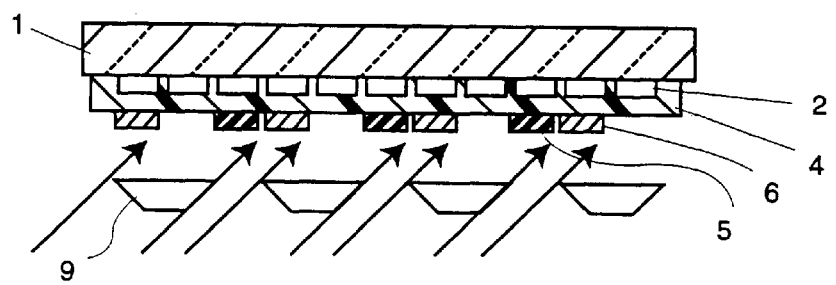
Figure 5:
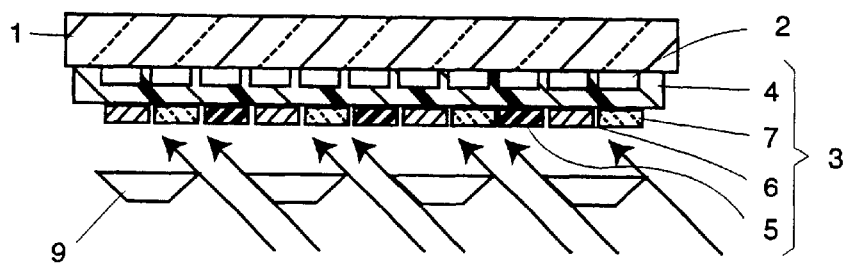

Thereafter, a current flows through the resistance heat boat 12 of Alq3 within the vacuum evaporation device 10 which are placed under this substrate and the shadow mask 9, and the resistance heat boat is heated. The Alq3 is evaporated with a film thickness of 50 μm on a surface of the above-mentioned hole transporting layer 4, wherein an Alq3 layer is formed as the green luminous layer 5 as shown in FIG. 5(*a*). Next, the distyrene derivative or coumarine derivative is evaporated with a film thickness of 50 nm and the blue luminous layer 6 is formed as shown in FIG. 5(*b*), and further, the magnesium phthalocyanine is evaporated with a film thickness of 50 nm and the red luminous layer 7 is formed as shown in FIG. 5(*c*). It is preferable that an evaporation rate is 2–10 Å/sec.

These different luminous materials are attached to desired positions on the transparent support substrate 1 through the opening section of the shadow mask 9 in accordance with the placement of the resistance heat boats 11, 12 and 13.

Thereafter, magnesium and silver for example are evaporated to form a cathode 8, and the color thin film electroluminescent display apparatus shown in FIG. 4 can be obtained.

Figure 6:
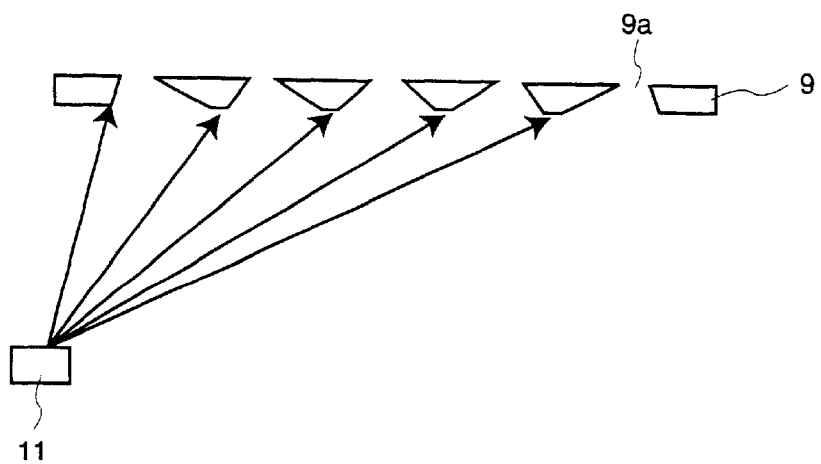
FIG. 6 is a cross sectional view showing evaporation condition for explaining the second embodiment of the present invention.
Figure 7:
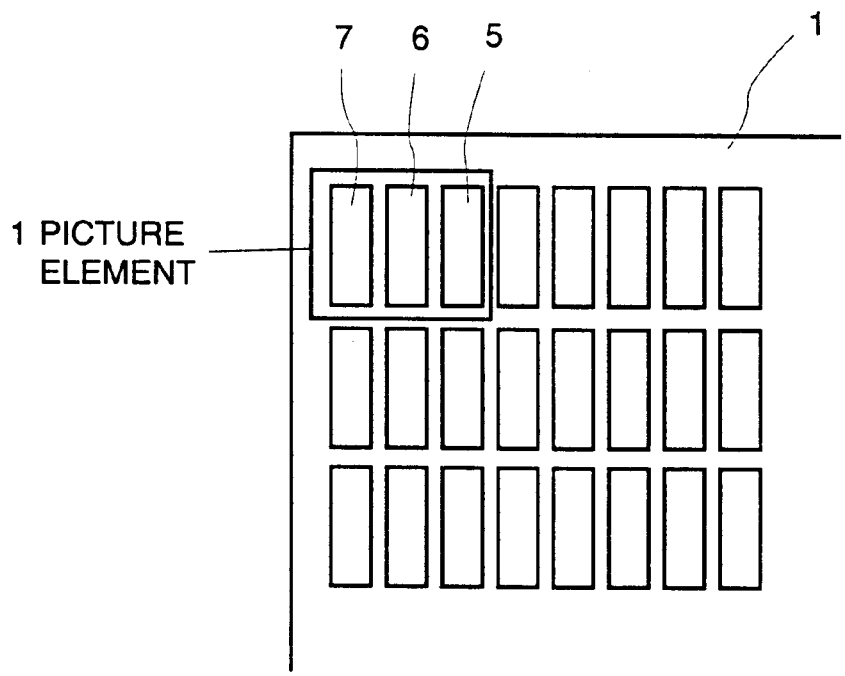
FIG. 7 is a plan view of a color organic thin film electroluminescent display apparatus.
Figure 8:
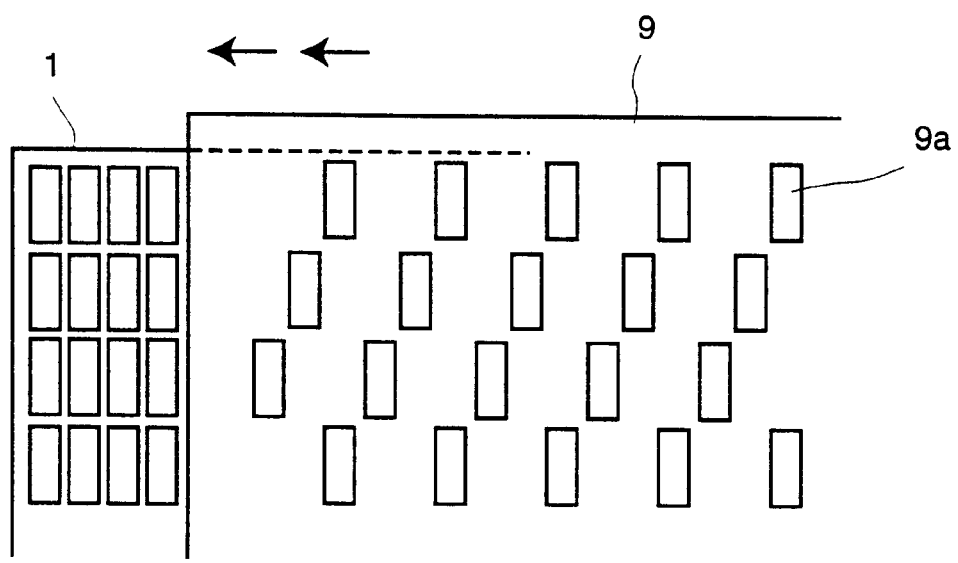
FIG. 8 is a plan view for explaining a conventional manufacturing method.
Figure 9:
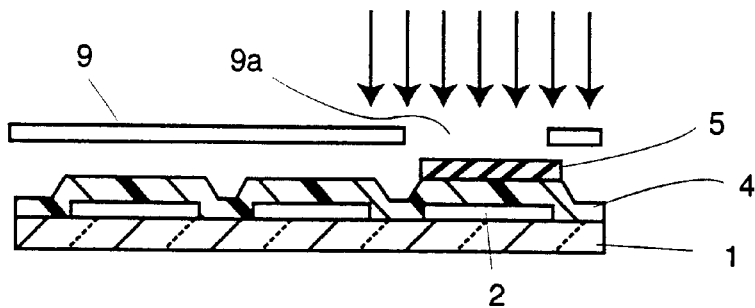
FIGS. 9(a) to (d) are cross sectional views of the order of a process for explaining the conventional manufacturing method.
Figure 9:
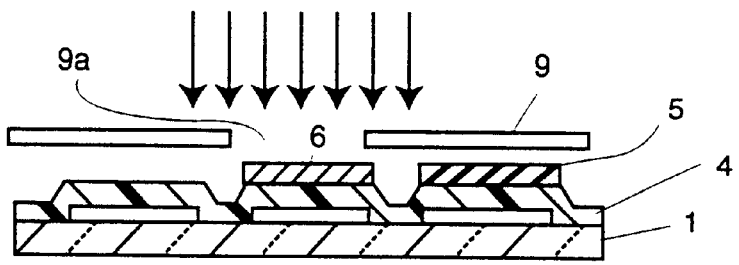
Figure 9:
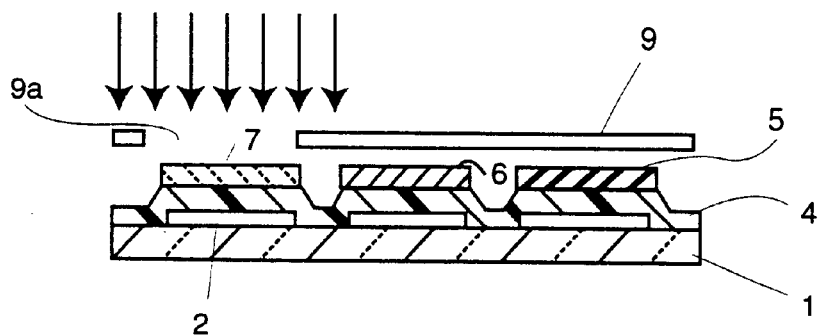
Figure 9:
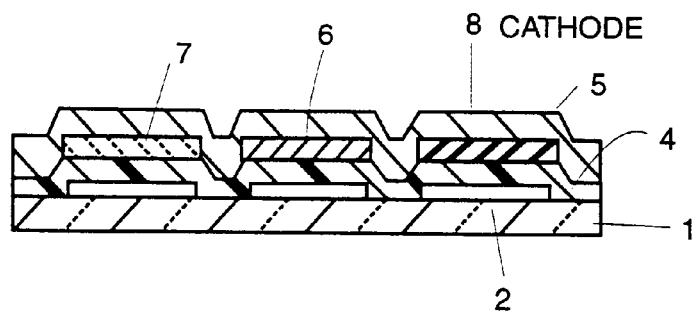

FIG. 6 is a cross sectional view showing an essential part of evaporation condition for explaining a second embodiment of the present invention. In this embodiment, the shadow mask shown in FIG. 1(e) is used. Also, a cross sectional view of an electroluminescent display apparatus manufactured by this embodiment is shown in FIG. 4.

Although, in order to evaporate a luminous material over an entire wide area at the same angle, it is necessary to use a large-sized evaporation device such that a fully large distance between the evaporation source and the substrate can be maintained, in this embodiment, the large-sized evaporation device is avoided by using the shadow mask 9 having a taper angle corresponding to an extent of an evaporation angle as shown in FIG. 6. As shown in FIG. 4, after the anodes 2 consisting of an ITO are formed on the transparent support substrate 1 and further the hole transporting layer 4 is formed thereon, by means of the same method as the case of the first embodiment, as shown in FIG. 6, the green luminous layer 5, the blue luminous layer 6 and the red luminous layer 7 are attached using the shadow mask 9 to form the organic electroluminescent layer 3.

The stainless shadow mask is previously placed within the vacuum evaporation device in which these luminous layers 5–7 are formed, and the substrate on which the organic electroluminescent layer 3 is formed is set on the shadow mask. This shadow mask is formed of SUS430 with a board thickness of 0.4 mm, and in the shadow mask, mask patterns are formed so that the patterns and clear electrodes (anodes) cross. In other words, thirty two stripe shaped opening patterns of a 0.56 mm width and an 80 mm length are formed in parallel with each other at a pitch of 0.6 mm.

Magnesium is put into one resistance heat boat fixed at a position where evaporation substances can be evaporated on the substrate through the shadow mask and silver is put into other resistance heat boats, and the magnesium and silver are simultaneously evaporated at an evaporation rate such that a ratio of the magnesium and silver is 10:1. In this way, without taking out the substrate from a vacuum reservoir, on which the organic electroluminescent layer 3 is formed, thirty two cathodes 8 consisting of a mixed metal of magnesium and silver are formed on the organic electroluminescent layer 3.

When the electroluminescent display apparatus manufactured in this manner is driven by time-divisionally scanning the cathodes, applying a pulse voltage thereto and flowing a pulse current from a constant-current circuit through selected anodes in accordance with scan timing of the cathodes, a desired display pattern can be turned on.

As explained above, since, in the present invention, using the shadow mask having the opening sections in which a taper is formed, the color electroluminescent thin film is formed by vaporizing substances to be attached from a vaporization position in accordance with a taper angle thereof, the color thin film electroluminescent display apparatus having a fine pitch can be manufactured without exchanging or moving the shadow mask. Therefore, according to the present invention, it becomes to be possible to manufacture the electroluminescent display apparatus without complicating the apparatus and while the process is simplified.

Also, since the taper is formed at the opening sections of the shadow mask in accordance with a direction along which vaporization substances come flying, a high accurate film to be attached that has a fine pitch can be obtained while having a thickness capable of maintaining the strength of the shadow mask.

The entire disclosure of Japanese Patent Application No. 9-125188 filed on May 15, 1997 including specification, claims, drawing and summary are incorporated herein by reference in its entirety.

What is claimed is:

1. A shadow mask comprising:
   a main plate having an upper surface and a lower surface; and
   a plurality of opening sections formed at a constant spacing and having a cross sectional shape comprising opposing symmetrical tapered portions, the cross sectional shape being oblique from a direction perpendicular to the upper surface and lower surface of the main plate in accordance with a direction along which evaporated substances from evaporation sources are emitted.

2. A shadow mask according to claim 1, wherein thin plates having said opening sections are pasted together, and dimensions of said opening sections are different step by step.

3. A shadow mask according to claim 1, wherein a taper angle between said main surface and a side surface of said opening sections is gradually large as a distance from said evaporation sources is large.

4. A color thin film electroluminescent display apparatus comprising:
   a substrate;
   anodes formed on said substrate;
   an electroluminescent layer including
      a hole transporting layer formed on said substrate and said anodes, and
      luminous layers formed on said hole transporting layer; and
   cathodes formed on said hole transporting layer and said luminous layers,
   wherein said luminous layers are formed through a shadow mask in which a plurality of opening sections are formed at a constant spacing and having a cross sectional shape comprising opposing symmetrical tapered portions the cross sectional shape being oblique from a direction perpendicular to a surface in accordance with a direction along which evaporated substances from evaporation sources are emitted.

5. A color thin film electroluminescent display apparatus to claim 4, wherein said shadow mask is formed so that thin plates having said opening sections are pasted together, and dimensions of said opening sections are different step by step.

6. A color thin film electroluminescent display apparatus according to claim 4, wherein a taper angle between said main surface and a side surface of said opening sections is gradually large as a distance from said evaporation sources is large.

7. A color thin film electroluminescent display apparatus according to claim 4, wherein said luminous layers are consisted of green, blue and red luminous layers.

8. A color thin film electroluminescent display apparatus according to claim 4, wherein said hole transporting layer, said luminous layers and cathodes are successively formed in a vacuum evaporation device.

9. A shadow mask of claim 1, wherein said opening sections have a same diameter opening at the upper surface and the lower surface.

10. A shadow mask of claim 1, wherein said opening sections are tapered inward from the upper surface and the lower surface towards a center of said main plate, and the taper angle at both the upper surface and the lower surface are a same taper angle.

11. A shadow mask of claim 1, wherein a central portion of the opening sections between the upper surface and the lower surface has a same diameter.

12. A shadow mask of claim 4, wherein said opening sections have a same diameter opening at the upper surface and the lower surface of the shadow mask.

13. A shadow mask of claim 4, wherein said opening sections are tapered inward from the upper surface and the lower surface towards a center of said shadow mask, and the taper angle at both the upper surface and the lower surface are a same taper angle.

14. A shadow mask of claim 4, wherein a central portion of the opening sections between the upper surface and the lower surface of the shadow mask has a same diameter.

15. A shadow mask, comprising:

a main surface; and opening sections formed at a constant spacing and having a cross sectional shape that is oblique to the main surface in accordance with a direction along which evaporated substances from evaporation sources are emitted, said opening sections having a taper angle which is non-symmetrical along a line perpendicular to the main surface.

16. A shadow mask of claim 15, wherein a first side of said opening sections has a larger taper angle than a taper angle of a second side of said opening sections.

* * * * *